United States Patent [19]
Mishuku et al.

[11] Patent Number: 5,786,075
[45] Date of Patent: Jul. 28, 1998

[54] HEAT SINKS AND PROCESS FOR PRODUCING THE SAME

[75] Inventors: Minoru Mishuku, Kanagawa-ken; Osamu Terada, Ibaraki-ken, both of Japan

[73] Assignee: Fuji Die Co., Ltd., Tokyo, Japan

[21] Appl. No.: 412,391

[22] Filed: Mar. 28, 1995

[30] Foreign Application Priority Data

Feb. 10, 1995 [JP] Japan ................... 7-023136

[51] Int. Cl.⁶ .................................. B32B 19/00
[52] U.S. Cl. ............... 428/325; 428/328; 428/408; 428/688; 428/698; 165/905; 501/87; 501/90
[58] Field of Search ................... 428/408, 402, 428/403, 323, 328, 688, 325, 698; 165/185, 905; 257/713, 729, 675; 361/704, 705, 709; 501/87, 90

[56] References Cited

U.S. PATENT DOCUMENTS

| | | |
|---|---|---|
| 4,902,652 | 2/1990 | Kume .................................. 501/90 |
| 5,270,114 | 12/1993 | Herb .................................. 428/403 |

FOREIGN PATENT DOCUMENTS

| | | |
|---|---|---|
| 0174546 | 11/1984 | European Pat. Off. . |
| 57100981 | 12/1980 | Japan . |
| 57-100981 | 6/1982 | Japan . |
| 61-237457 | 10/1986 | Japan . |
| 62-223907 | 10/1987 | Japan . |
| 2-273960 | 11/1990 | Japan . |
| 4-315461 | 11/1992 | Japan . |
| 5-326767 | 12/1993 | Japan . |
| 5-339730 | 12/1993 | Japan . |

*Primary Examiner*—Timothy Speer
*Attorney, Agent, or Firm*—Jordan and Hamburg

[57] ABSTRACT

Provided is a heat sink which has excellent processability and is economical, even though it employs diamond, as well as, a process for producing the same. The heat sink is molded using a composition obtained by adding a diamond powder of 0.1 to 100 μm high-purity diamond particles to cemented carbide primarily of WC and a balance of at least one metal selected from Co, Ni and Fe along with impurities. The proportion of the diamond powder admixed relative to the cemented carbide is preferably 5 to 90%, and the diamond heat sink is produced by sintering the particulate mixture of diamond, WC, Co, etc. at a temperature of 1200° to 1500° C. under a pressure of 3 to 6 GPa.

4 Claims, 1 Drawing Sheet

HEAT SINKS AND PROCESS FOR PRODUCING THE SAME

BACKGROUND OF THE INVENTION

This invention relates to a heat sink for electronic industries, more particularly to a heat sink utilizing diamond which is suitable for semiconductor radiators and other electronic devices, and also to a process for producing the same.

As well known in the art, studies are extensively made so as to achieve extremely high densities with respect to the physical density per unit area such as microchip circuit density and substrate packaging density. The degree of heat radiation is increased as the densities are improved, so that the heat radiating capabilities of the circuits and substrates must be increased correspondingly. For such purpose, various types of heat sinks have been proposed.

As such sinks, diamond heat sinks having high thermal conductivity values can be given. This type of diamond heat sink includes a plate-like heat sink made of natural diamond as a simple substance, a heat sink having a laminar structure produced by forming an artificial diamond crystal layer on a plate-like substrate by means of vapor phase synthesis (for example, as disclosed in Japanese Unexamined Patent Publication (KOKAI) No. 2-273960) and one produced by vapor-depositing an artificial diamond crystal layer on a substrate.

Further, a heat sink made of a copper-tungsten (Cu—W) alloy is also known.

Although heat sinks produced by using natural diamond are advantageous for obtaining high thermal conductivity, they involve problems in the aspects of processability, size and cost. It is true that the artificial diamond heat sink produced by synthesizing an artificial diamond surface layer on a substrate has better processability than in the natural diamond heat sink, but the former has a laminar structure, so that the degrees of freedom in post-processing to be applied after lamination is limited by the presence of the surface diamond layer. Further, the heat sink produced by vapor-depositing an artificial diamond on a substrate also suffers poor processability, and besides the thickness of the diamond layer to be formed by vapor deposition is limited. Anyway, the prior art heat sinks, whether they may be produced by using natural diamond or an artificial diamond by means of synthesis or vapor deposition (coating), involve too many difficulties in processing and producing final products having the desired dimensions and shapes, and they also cost very high. Accordingly, further improvements are desired.

Meanwhile, the heat sink made of a copper-tungsten alloy is superior in terms of economical aspect and workability, compared with the diamond heat sinks described above. However, the high thermal conductivity obtained in the diamond heat sinks cannot be expected, and if the size of the heat sink is reduced, the heat radiating performance occasionally becomes insufficient.

SUMMARY OF THE INVENTION

The present inventors selected diamond powder so as to take full advantage of the low coefficient of thermal expansion and high thermal conductivity characteristic of diamond, and they found that an economical heat sink having excellent processability can be formed without impairing the properties, i.e. low coefficient of thermal expansion and high thermal conductivity, of diamond by using a diamond powder in combination with cemented carbide to accomplish this invention.

According to this invention, cemented carbide incorporated with a diamond powder is subjected to molding to obtain a heat sink. The proportion of the diamond powder to be admixed relative to the cemented carbide is preferably 5 to 90%.

The thus obtained heat sink is combined with an electronic device to be in thermal contact therewith.

In the above and following descriptions, the expression "electronic device" is used broadly to define many devices including microchips; IC parts such as ceramic package substrates and hybrid substrates; optical parts such as stems and carriers; microwave parts such as ceramic package substrates, metal package circuit substrates and IMPATT diodes; power transistors and thyristor parts; and other parts for electronic industries.

Since cemented carbide particularly has low coefficients of thermal expansion and high thermal conductivity values among other metals, heat sinks having coefficients of thermal expansion approximate to those of the designed electronic devices can be formed by combining such hard metal with the diamond powder without impairing the high thermal conductivity characteristic to diamond.

The heat sink formed according to this invention has excellent processability and can be wetted well by waxy materials compared with the heat sink having a diamond layer laminated thereon and the heat sink having a diamond layer vapor-deposited (coated) on a substrate, so that it can easily be subjected to brazing and soldering, and also it is inexpensive. Further, compared with the copper-tungsten alloy heat sink, the heat sink of the invention can be reduced in the size and can be expected to exhibit high heat radiating performance.

The features of this invention that are believed to be novel are set forth with particularity in the appended claims. The invention, together with the objects and advantages thereof, may best be understood by reference to the following description of the preferred embodiments taken in conjunction with the accompanying drawing.

PREFERRED EMBODIMENT OF THE INVENTION

Figure 1:
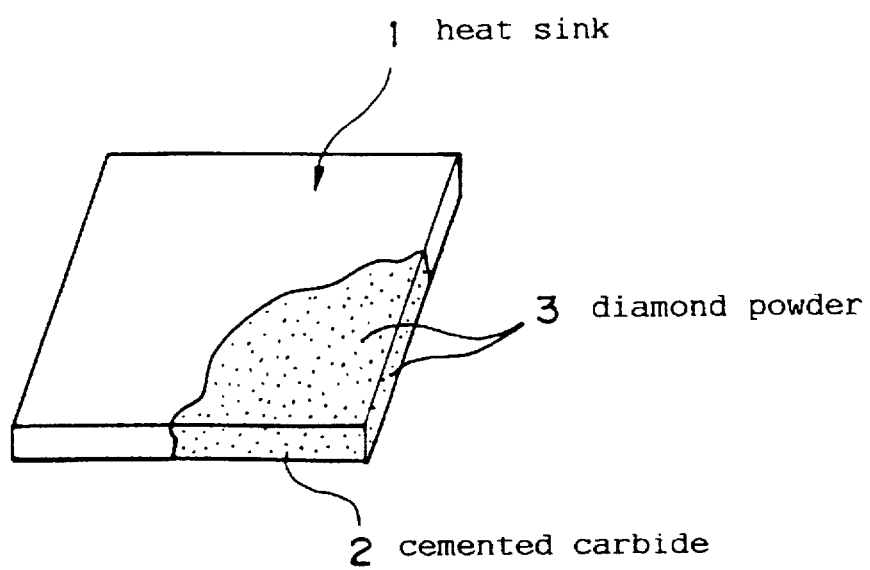
FIG. 1 shows partly in cross section a perspective view of a heat sink according to one embodiment of this invention.

Next, this invention will be described by way of Examples. A heat sink 1 having the shape as shown in FIG. 1 was formed using cemented carbide 2 and a diamond powder 3. The following materials were used for forming the heat sink 1.

[Table 1]

Cemented carbide: composition WC-10% Co

WC diameter ca. 1.5 μm,

Diamond powder: RVC200/230; particle size 0.3 to 100 μm.

manufactured by General Electric Co., Ltd.

Heat sinks having a chip size of 10 mm×10 mm×1 mm (thickness) were formed (Samples 1 to 4) using the above composition, in which the proportion of the powder relative to the cemented carbide was adjusted between 10 to 40%, and were subjected to sintering treatment in a high pressure generator at 1300° C. under a pressure of 5 GPa. When the thermal conductivity of each heat sink thus formed was examined, the following results were obtained.

[TABLE 2]

| Sample No. | Cemented carbide | Diamond powder | Thermal conductivity |
|---|---|---|---|
| 1 | 60% | 40% | 1.5 cal/cm/sec/°C. |
| 2 | 70% | 30% | 1.2 cal/cm/sec/°C. |
| 3 | 80% | 20% | 0.8 cal/cm/sec/°C. |
| 4 | 90% | 10% | 0.5 cal/cm/sec/°C. |

When the heat sinks were subjected to wire cutting, they were cut with no problem under the same cutting conditions as used for hard metal products. When the heat sinks were further subjected to polishing using a planing machine, they were processed with no difficulty, although the grindstone wore considerably.

When each of the sample heat sinks was combined, in place of the Cu—W system heat sink, with an IC package to be in thermal contact therewith, it was confirmed that it exhibited very excellent heat radiating capability.

Further, in the cases where heat sinks were formed in the same manner as described above, except that the proportion of the diamond powder was changed to 5 to 10% or 40 to 90%, the designed thermal conductivity values were obtained.

As has been described heretofore, the heat sink according to this invention is accomplished by using diamond powder in combination with cemented carbide, which is selected as a counterpart material thereof, in place of synthesizing or vapor-depositing (coating) a diamond layer on a substrate as has conventionally been practiced. Accordingly, the thus obtained heat sink can exhibit a coefficient of thermal expansion approximate to the designed electronic device, while the high thermal conductivity of the diamond is not impaired by the cemented carbide having particularly low coefficient of thermal expansion and high thermal conductivity among other metallic materials. The heat sink of this invention has excellent processability compared with the conventional diamond heat sink. Additionally the cemented carbide can be wetted well with waxy materials, so that the heat sink can readily be subjected to brazing or soldering, and it is inexpensive. Further, compared with the copper-tungsten alloy heat sink, the heat sink of the invention enjoys a great advantage in that it can be reduced in size and can exhibit high heat radiating performance.

What is claimed is:

1. A molded heat sink comprising cemented carbide and diamond powder, the diamond powder constituting 10 to 40% by weight of the molded heat sink.

2. The heat sink according to claim 1, wherein the diamond powder has diamond particles having a particle size of 0.1 to 100 μm and said cemented carbide is WC and at least one metal selected from the group consisting of Co, Ni and Fe.

3. The heat sink according to claim 1, wherein the proportion of the diamond powder is 20–40% by weight of the molded heat sink.

4. The heat sink according to claim 1, wherein the diamond powder constitutes 30–40% by weight of the molded heat sink.

* * * * *